(12) United States Patent
Schmidt et al.

(10) Patent No.: US 6,596,421 B2
(45) Date of Patent: Jul. 22, 2003

(54) ELONGATED SUPERCONDUCTOR STRUCTURE WITH A HIGH-TC SUPERCONDUCTOR MATERIAL AND A METALLIC MOUNT, AND METHOD FOR PRODUCING THE STRUCTURE

(75) Inventors: Wolfgang Schmidt, Erlangen (DE); Gisela Sipos, Oberkochen (DE); Bernd Utz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 150 days.

(21) Appl. No.: 09/920,109

(22) Filed: Aug. 1, 2001

(65) Prior Publication Data

US 2002/0022578 A1 Feb. 21, 2002

Related U.S. Application Data

(63) Continuation of application No. PCT/DE00/00238, filed on Jan. 27, 2000.

(30) Foreign Application Priority Data

Feb. 1, 1999 (DE) .......................... 199 03 871

(51) Int. Cl.⁷ .......................... B32B 19/00; B32B 9/00; H01L 39/00; B05D 5/12; B05D 1/36

(52) U.S. Cl. .................. 428/701; 428/702; 505/230; 505/237; 505/238; 505/434; 505/470; 427/62; 427/419.3

(58) Field of Search .................. 505/230–237, 505/238, 430, 434, 470; 428/332, 380, 384, 699, 701, 702, 930; 427/62, 419.1, 419.2, 419.3; 174/125.1

(56) References Cited

U.S. PATENT DOCUMENTS 5,739,086 A 4/1998 Goyal et al.
5,741,377 A 4/1998 Goyal et al.

(List continued on next page.)

FOREIGN PATENT DOCUMENTS

| EP | 0 292 959 | 11/1988 |
| EP | 1195819 A1 * | 4/2002 |
| WO | PCT/US96/05486 | 10/1996 |

OTHER PUBLICATIONS

D.K. Fork et al.: "Effects of homoepitaxial surfaces and interface compounds on the in–plane epitaxy of YBCO films on yttria–stabilized zirconia" 1992 Materials Research Society J.Mater. Res., vol. 7, No. 7, Jul. 1992.

A. Goyal et al.: "Epitaxial superconductors on rolling–assisted biaxially–textured substrates (RABiTS): a route towards high critical current density wire", Applied Superconductivity vol. 4, Nos. 10–11, pp. 403–427, 1996.

(List continued on next page.)

Primary Examiner—Tom Dunn
Assistant Examiner—Colleen P. Cooke
(74) Attorney, Agent, or Firm—Laurence A. Greenberg; Werner H. Stemer; Ralph E. Locher

(57) ABSTRACT

The superconductor structure has a metallic, biaxially textured mount, an intermediate layer system deposited on the mount and including at least two intermediate layers composed of different oxidic materials and, on this, a high-$T_c$ superconducting layer of the $M_2Cu_3O_x$ type (RE=rare earth; M=alkaline-earth metal). The intermediate layer which faces the mount is composed of $Y_2O_3$, and the relatively thinner intermediate layer which faces the superconducting layer is composed of $CeO_2$. The layers are preferably grown heteroepitaxially.

14 Claims, 1 Drawing Sheet

U.S. PATENT DOCUMENTS

| | | | | |
|---|---|---|---|---|
| 5,872,080 A | * | 2/1999 | Arendt et al. | 505/238 |
| 5,986,536 A | * | 11/1999 | Ries et al. | 338/13 |
| 6,114,287 A | * | 9/2000 | Lee et al. | 505/473 |
| 6,150,034 A | * | 11/2000 | Paranthaman et al. | 428/472 |
| 6,156,376 A | * | 12/2000 | Paranthaman et al. | 427/126.3 |
| 6,258,472 B1 | * | 7/2001 | Neumuller et al. | 428/701 |
| 6,459,610 B1 | * | 10/2002 | Prall | 365/149 |

OTHER PUBLICATIONS

A. Ignatiev: "Photo–assisted MOCVD growth of YBCO thick films for wire applications" Applied Superconductivity vol. 4, Nos. 10–11, pp. 455–463, 1996.

Ataru Ichinose: "Deposition of $Y_2O_3$ buffer layers on biaxially—textured metal substrates" Physica C 302 (1998) pp. 51–56.

John E. Mathis et al.: "Biaxially Textured $YBa_2Cu_3O_{7-\delta}$ Conductors on Rolling Assisted Biaxially Textured Substrates with Critical Current Densities of 2–3 $mA/cm^2$", Jpn. J.Appl. Phys. vol. 37 (1998) Pt. 2, No. 11B.

Y. Iijima et al.: "Self–field ac losses in biaxially aligned Y–Ba–Cu–O tape conductors", Appl. Phys. Lett. 71 (18), Nov. 3, 1997, pp. 2695–2697.

H.R. Kerchner: "Alternating current losses in biaxially textured $YBa_2Cu_3O_{7-\delta}$ films deposited on Ni tapes", Appl. Phys. Lett. 71 (14) Oct. 6, 1997, pp. 2029–2031.

A. Knierim et al.: "High Critical Current Densities of $YBa_2Cu_3O_{7-x}$ thin films on buffered technical substrates" Appl. Phys. Lett. 70 (5), Feb. 3, 1997, pp. 661–663.

X. D. Wu et al.: "High Current $YBa_2Cu_3O_{7-\delta}$ thick films on flexible nickel substrates with textured buffer layers" Appl. Phys. Ltt. 65 (15) Oct. 10, 1994, pp. 1961–1963.

X. D. Wu et al.: "Properties of $YBa_2Cu_3O_{7-x}$ thick films on flexible buffered metallic substrates", Appl. Phys. Lett. 67 (16), Oct. 16, 1995, pp. 2397–2399.

* cited by examiner

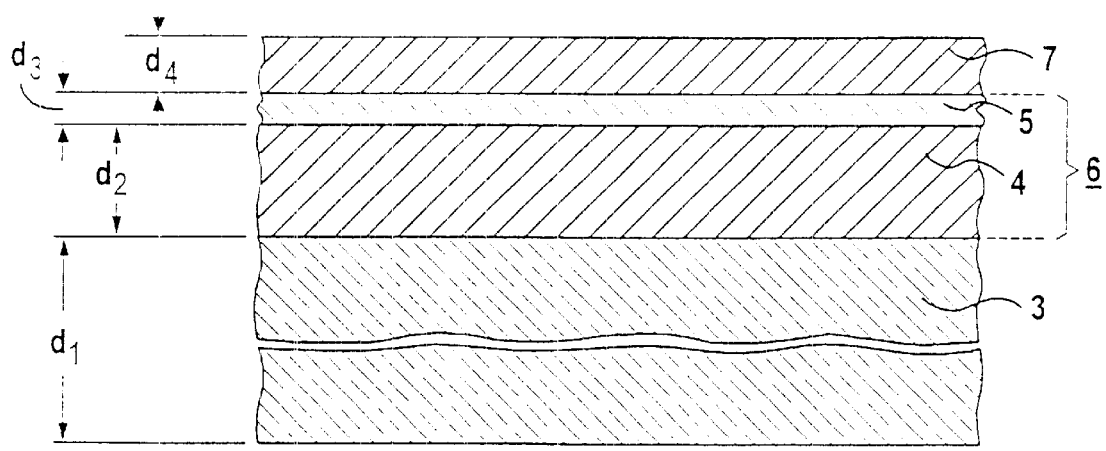
2

ELONGATED SUPERCONDUCTOR STRUCTURE WITH A HIGH-TC SUPERCONDUCTOR MATERIAL AND A METALLIC MOUNT, AND METHOD FOR PRODUCING THE STRUCTURE

CROSS-REFERENCE TO RELATED APPLICATION

This is a continuation of copending International Application No. PCT/DE00/00238, filed Jan. 27, 2000, which designated the United States.

BACKGROUND OF THE INVENTION

Field of the Invention

The invention relates to an elongated superconductor structure for carrying an electric current in a predetermined direction. The structure is intended to have the following parts: a biaxially textured mount composed of metallic material, an intermediate layer system which is deposited on the mount and has at least two intermediate layers composed of different oxide materials, and a superconducting layer which is deposited on the intermediate layer system and is composed of a high-$T_c$ superconductor material of the $(RE)M_2Cu_3O_x$ type. The RE component contains at least one rare earth metal (including yttrium) and the M component contains at least one alkaline-earth metal. The invention also relates to a method for producing such a superconductor structure. A corresponding superconductor structure and a method for producing it can be found in *Applied Superconductivity*, 1996, Vol. 4, Nos. 10–11, pages 403 to 427.

Superconducting metal-oxide compounds having high critical temperatures Tc of above 77 K are known. They are therefore also referred to as high-$T_c$ superconductor materials or HTS materials. Their particular advantage is that they allow a liquid nitrogen ($LN_2$) cooling technique. Metal-oxide compounds such as these include, in particular, cuprates based on specific material systems such as that of the (RE)-M—Cu—O type with the RE components containing at least one rare earth metal (including Y), and the M component containing at least one alkaline-earth metal. The main representative of this type is the material $YBa_2Cu_3O_x$ (referred to as "YBCO").

Attempts are being made to deposit these known HTS materials on different mounts (substrates) for different application purposes. The aim is, in general, to produce a textured superconductor material with as high a phase purity as possible, in order to achieve a high current carrying capacity. The term texturing in this case means the alignment of the crystallite of a polycrystalline structure. In particular, elongated metallic mounts are intended for conductor applications. See, for example, U.S. Pat. No. 4,921,833 (corresponding European EP 0 292 959 A2) to Takano.

In the case of a corresponding superconductor structure for conductor applications, the HTS material is generally not deposited directly on a metallic mount strip used as a substrate; instead, this mount strip is first of all covered by at least one thin intermediate layer, which is also referred to as a buffer layer. This intermediate layer has a thickness in the order of magnitude of about 1 μm and is intended to prevent metal atoms from diffusing out of the mount material into the HTS material, in order to prevent the superconducting characteristics from being adversely affected as a result of this. At the same time, such an intermediate layer, which is used as a diffusion barrier, allows the surface to be smoothed and the adhesion of the HTS material to be improved. Appropriate intermediate layers are composed in particular of oxides of metals such as zirconium, cerium, yttrium, aluminum, strontium or magnesium, or of alloys with these metals, and are thus in general dielectrics.

In addition to the characteristic as a diffusion barrier, this at least one intermediate layer is, furthermore, intended to satisfy the requirements of allowing textured growth of the HTS material to be applied to it. In consequence, the intermediate layer must itself have a corresponding texture. The transfer of the crystallographic orientation during the growth of a layer on a substrate of a chemically different type is known by the term heteroepitaxy. In that case, the unit cells in the intermediate layer must have dimensions which are matched as well as possible to the lattice constants of the HTS material. Furthermore, it should have a thermal coefficient of expansion which at least approximately matches that of the HTS material in order in this way to avoid undesirable mechanical stresses during the temperature cycles, which are unavoidable for applications relating to superconducting technology and for layer preparation, and possible damage such as exfoliation resulting from this.

The choice of the "mount-intermediate layer" system is subject to similar requirements. In that case as well, good adhesion characteristics are desirable, and, at the same time, the desired heteroepitaxy between the intermediate layer and the HTS layer which is growing on it must not be adversely affected.

For the reasons mentioned above, the literature reference cited initially provides for a metal strip whose surface is biaxially textured by means of a rolling process and which is composed of copper or nickel to be used as the mount strip, on which an intermediate layer in the form of a $CeO_2$ layer (as the first buffer layer) and a thicker layer composed of $ZrO_2$ stabilized with Y ($Zr(Y)O_2$ as the second buffer layer) are deposited. This combination was chosen since $CeO_2$ can be deposited heteroepitaxially in a reducing atmosphere on textured nickel in order to avoid oxidation of the metal surface. However, the oxygen deficit which results in this case in the $CeO_2$ and the enlargement of the lattice constants associated with this mean that there is a tendency for the layer to form cracks. $CeO_2$ layers with a maximum thickness of only 100 nm are therefore used, in order to restrict the surface density at corresponding cracks. This is because thicker $CeO_2$ layers tend to form cracks more easily than thin layers. This makes it necessary to use a second layer composed of $Zr(Y)O_2$ in order to allow any cracks or other mechanical damage to be covered. This second layer must be made sufficiently thick, for example up to 1 μm, that it represents the actual diffusion barrier. A corresponding intermediate is layer system is described, inter alia, in U.S. Pat. Nos. 5,739,086 and in 5,741,377.

Such a conductor structure is thus subject to the requirement for deposition of crack-free intermediate layers, which are resistant to diffusion, on metal strips. Furthermore, a biaxially textured metal strip must be assumed in order to achieve the heteroepitaxy which is important for high critical current densities $J_c$, in order in this way to allow the texture of the strip to be transferred to the superconducting material. The aim of this is to allow the production of conductors in the form of strips and having a long length that are coated with superconducting YBCO material or a corresponding HTS material.

High critical current densities $J_c$ in the YBCO layer of at least $1 \times 10^5$ A/cm² and with the YBCO material having a layer thickness of, for example, 0.8 μm are required for the applications which have been conceived of so far for lossfree transmission of high currents, for example in the form of wound strips in solenoid coils or transformers, which are then subject to high magnetic fields. This could be achieved only by aligning the crystallites of the YBCO layer in the same way in the crystalline a-b plane since then, as is known, small angle grain boundaries result in a high current carrying capacity. This is also referred to as a biaxial texture. This leads to the necessity for the biaxial structure which already exists in the mount to be transferred through the intermediate layers to the YBCO. What is referred to as the full width at half maximum (FWHM) in an x-ray "Phi scan" is used as a measure of the quality of the biaxial texture; this should not significantly exceed 10° for the intermediate layer system. Corresponding experiments are described in the *Journal of Materials Research,* Volume 7, No. 7, July 1992, pages 1641–51, in particular pages 1644–1645.

SUMMARY OF THE INVENTION

It is accordingly an object of the invention to provide a high-temperature superconductor structure and a corresponding production method, which overcomes the above-mentioned disadvantages of the heretofore-known devices and methods of this general type and which specifies an intermediate layer system that satisfies the requirements mentioned so that even relatively long pieces of mount, in particular of more than 1 m and preferably of more than 100 m, can be coated with a constant quality. The specific technological object is to prevent diffusion of metal atoms from the mount material into the YBCO layer in the same way as diffusion of oxygen, which is required during the deposition and formation of the YBCO, to the metal surface. This is because such oxygen diffusion would lead to metal oxidation at the normal deposition and heat-treatment temperatures for the YBCO material in the range from about 600 to 800° C., and would thus decrease the adhesion strength of the intermediate layer. For this reason, intermediate layer thicknesses of between about 0.5 and 2 $\mu$m are generally required, with these thicknesses being dependent on the chosen intermediate layer material.

With the foregoing and other objects in view there is provided, in accordance with the invention, an elongated superconductor structure for carrying an electric current in a predetermined direction, comprising:

a biaxially textured mount composed of metallic material;
an intermediate layer system including a first, relatively thicker, intermediate layer of yttrium oxide deposited on the mount and a second, relatively thinner, intermediate layer of cerium oxide above the first intermediate layer; and
a superconductor layer deposited on the second intermediate layer and composed of a high-$T_c$ superconductor material of the $(RE)M_2Cu_3O_x$ type, with an RE component containing at least one rare earth metal, and an M component containing at least one alkaline-earth metal.

In other words, the above objects are satisfied, in the context of the above-mentioned superconductor structures, with an intermediate layer system having an intermediate layer which faces the mount and is composed of yttrium oxide and a relatively thinner intermediate layer which faces the superconductor material and is composed of a cerium oxide. The main representatives of these oxides are $Y_2O_3$ and $CeO_2$. Minor impurities or additives, in particular of other metal oxides, up to a proportion of 5% by weight should, however, in each case also be included.

The advantages associated with this configuration of the intermediate layer system are, in particular, as follows:

The (first) intermediate layer, which faces the mount, can be grown heteroepitaxially on the metallic mount; this can be ensured by the prevention of oxide formation on the metal surface. To this end, the metal oxide in the first intermediate layer must be deposited in a reducing or low-oxygen atmosphere, and must have a considerably higher bonding energy than the metal oxide in the mount material. These requirements can be satisfied by the chosen $Y_2O_3$.

The (second) intermediate layer, which faces the superconductor material, has a lattice constant which is very well matched to the chosen superconductor material. The corresponding error (referred to as the lattice mismatch) is, specifically, less than 1.6% when using $CeO_2$, while the equivalent error for Y-stabilized $ZrO_2$ is 5.5%.

The overall intermediate layer system prevents chemical reactions between the metal of the mount material and the superconductor material during the necessary processes for coating the mount. This is because it has a low diffusion rate for the elements involved. Furthermore, it can be configured such that it is reproducible even over great lengths, with no macroscopic defects such as cracks occurring. The chosen combination of intermediate layer materials is, in consequence, particularly suitable for producing an elongated conductor structure with a great length using the materials for its mount and its superconductor.

Advantageous refinements of the superconductor structure according to the invention can be found in the dependent claims relating.

In accordance with an advantageous feature of the invention, a mount composed of nickel or a nickel alloy is chosen. Firstly, this is because mounts composed of materials such as these have a thermal coefficient of expansion which is in the same order of magnitude as that of $Y_2O_3$. Secondly, the required biaxial texture can be produced in a manner known per se (see the literature reference cited initially) and relatively easily on the mount surface to be coated.

In a corresponding way, the mount is preferably provided with a rolled texture on its surface facing the intermediate layer system.

The superconductor material is $AD_2Cu_3O_x$ preferably of the $YBa_2Cu_3O_x$ (YBCO) type.

It is just as possible to use a material in which, based on YBCO, the Y component and/or the Ba component are/is at least partially replaced by an element from the respectively corresponding group. In accordance with an added feature of the invention, the A component represents yttrium and other elements of its group, and the D component represents barium and other elements of its group. This means, at least one of the yttrium and barium components may be at least partially replaced by an element from their respective group.

The $CeO_2$ intermediate layer advantageously has a thickness of less 200 nm, preferably of 100 nm, and of at least 10 nm. This layer thickness allows good heteroepitaxy to be ensured. Furthermore, it prevents the formation of cracks.

In accordance with another feature of the invention, it is found to be advantageous for the $Y_2O_3$ intermediate layer to have a thickness of between 200 nm and 2 $\mu$m. Such a relatively thick intermediate layer ensures the denseness of the entire intermediate layer system, even over great superconductor structure lengths.

It is particularly advantageous for at least largely heteroepitaxial growth of the intermediate layers and of the superconducting layer to be ensured for production of the superconductor structure. The full width half maximum (FWHM) in the X-ray phi scan should in this case be less than 20° and preferably less than 15°. This is because it allows a high critical current density $J_c$ to be achieved in the superconducting layer.

Other features which are considered as characteristic for the invention are set forth in the appended claims.

Although the invention is illustrated and described herein as embodied in an elongated superconductor structure with a high-$T_c$ superconductor material and a metallic mount, and a method for producing this structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE of the drawing shows, as an exemplary embodiment, one fundamental configuration option for a superconductor structure according to the invention.

DESCRIPTION OF THE PREFERRED EMBODIMENTS

The form of the superconductor structure according to the invention is based on embodiments which are known per se (see, for example, the above-cited U.S. Pat. No. 4,921,833). The superconductor structure, which is identified with the numeral 2 overall in the FIGURE, comprises at least: an elongated mount 3, which can also be referred to as a substrate, with a thickness d1. At least two intermediate layers 4, and 5, respectively, which can also be referred to as buffer layers, and which have respective thicknesses d2 and d3 are deposited on the mount. The two intermediate layers 4 and 5 are commonly designated as an intermediate layer system 6. A layer 7 having a thickness d4 and composed of a specific HTS material is applied to the intermediate layer system 6 formed in this way. A board or a strip, or any other elongated structure composed of a metallic material with any desired thickness d1 and with the surface dimensions required for the respective application is used for the mount. The mount may in this case be part of a composite body having at least yet one more element, although this is not illustrated in the FIGURE. This element may be provided for mechanical reinforcement and/or for electrical stabilization and is located, for example, on the side of the mount facing away from the intermediate layer system 6. Such a further element may be composed, for example, of copper.

Nickel (Ni) or a nickel alloy should be chosen as the metallic material for the mount 3. By way of example, specific nickel-copper-iron alloys, in particular with the trade name Monel® (Int'l Nickel Co.), or nickel alloys having at least one of the alloying partners V, Cr, Mo or nickel-iron alloys with a maximum proportion of 80% by atomic weight of iron are suitable.

In order to allow heteroepitaxial deposition of crack-free intermediate layers which are proof against diffusion on the mount, at least its surface facing the intermediate layer system 6 should be biaxially textured. One appropriate texture is also referred to as a "cobble-layer texture". This can be produced in a manner known per se by a rolling process followed by recrystallization heat treatment (see the literature reference, cited initially, on "Applied Superconductivity"). Appropriate substrates in the form of strips are known by the trade name "RABiTS" ("Rolling-Assisted Biaxially-Textured-Substrates"). In this case, a constantly high texture quality must be ensured over the entire (great) length of the mount, and this is also very significantly associated with the grain size. Excessively large grains can result in a poorly oriented grain boundary adversely affecting the current carrying capacity over up to the entire width of the conductor.

All known metal-oxidic high-$T_c$ superconductor materials which can be derived from the $(RE)_1M_2Cu_3O_x$ type may be used as HTS materials. In this case, the RE (Rare Earth) component should contain at least one rare earth element (including Y), such as Y. The M component is at least one alkaline-earth element such as Ba. The main representative of this type is $YBa_2Cu_3O_x$ (with x=7−δ, which is referred to as YBCO). At least one of the components of this material can, of course, at least partially be replaced by another material from the respective group.

The thickness d4 of the HTS layer is not in itself critical. It is in general less than 2 $\mu$m.

If required, the HTS layer 7 can also be covered by at least one further layer, such as a protective layer or a stabilization layer, in particular composed of silver or a silver alloy.

In order to allow textured growth, in particular epitaxial growth, as required for the HTS material to have a high critical current density $J_c$, the intermediate layer 5 which faces the HTS material is composed of a material which ensures such growth. $CeO_2$ is therefore particularly suitable for this purpose, since its unit cell is matched to the crystalline dimensions of the HTS material. The edge length of the $CeO_2$ unit cell is 5.41 Å, so that the diagonal has a length of 7.65 Å. This results in a discrepancy of 0.3% or 1.6%, respectively, from twice the edge length of a YBCO unit cell (a axis: 3.82 Å and b axis: 3.89 Å).

This layer 5, with a thickness d3 which is advantageously between 10 nm and 200 nm and preferably does not exceed 150 nm, and in particular does not exceed 100 nm, is located on the intermediate layer 4 which faces the mount 3. $Y_2O_3$ with a comparatively greater thickness should be chosen as the material for this (lower) intermediate layer. The thickness is in this case generally between 200 nm and 2 $\mu$m, for example, approximately 1 $\mu$m. Corresponding, 1 $\mu$m thick layers, which are deposited heteroepitaxially on the mount, advantageously do not have any cracks and also have what is referred to as an in-plane texture with a full width at half maximum of approximately 8°. However, YBCO deposited directly onto this still does not have adequate superconducting characteristics. It has been found that these characteristics can be considerably improved by the further intermediate layer 5 composed of $CeO_2$. This is because, if a corresponding layer 5 is deposited on the $Y_2O_3$ layer 4, this then results in an orthorhombic, biaxially textured YBCO being produced on the $CeO_2$ layer. The full width at half maximum of the texture is in this case approximately 11°, while the critical temperature Tc is approximately 85 K, with a ΔTc of approximately 3 K. Both a theta-2-theta-scan and a (111) pole figure of the $CeO_2$ layer show exclusive (100) orientation of the $CeO_2$ grains and a biaxial texture with a full width at half maximum of approximately 10°. Cracks do not once again occur in the $CeO_2$ until the layer thickness is considerably more than 100 nm.

If required, a further, thin layer may also be provided between the two intermediate layers 4 and 5, likewise being composed of oxidic material, and which does not impede the desired heteroepitaxy. One appropriate example would be a 5 to 20 nm thick layer composed of $Al_2O_3$, MgO, $SrTiO_3$ or $Zr(Y)O_2$. In general, it must be a discrete layer with a well defined (matched) lattice constant, which allows epitaxy.

The intermediate layers 4 and 5 are deposited successively on the mount in a manner known per se. All conventional processes are suitable for this purpose, such as sputtering, thermal vapor deposition or laser ablation. The intermediate layer materials are in this case generally deposited on the mount at raised temperatures.

The HTM material is then applied to the intermediate layer system 6 using known deposition methods and with the mount being heated. The most common of the PVD (Physical Vapor Deposition) technology methods which are suitable for this purpose are laser ablation using a pulsed laser, magnetron sputtering or, preferably, thermal co-vapor deposition (i.e., simultaneous vapor deposition of the HTS material components with an oxygen supply). CVD (Chemical Vapor Deposition) methods, in particular using metal-organic source materials, are also suitable. The methods must in this case preferably be selected such that heteroepitaxial deposition is ensured.

EXAMPLE

A specific exemplary embodiment of a conductor structure according to the invention, and schematically illustrated in the FIGURE, will now be described:

A first intermediate layer 4 composed of $Y_2O_3$ with a thickness d2 of 0.9 μm followed by a second intermediate layer 5 composed of $CeO_2$ with a thickness d3 of 0.1 μm were first of all deposited by means of laser ablation at 800° C. on the cobble-textured surface of an at least 10 cm long mount 3 in the form of a strip and composed of $Ni_{50}Fe_{50}$, whose thickness d1 was 0.1 mm, and whose width was 10 mm. A YBCO layer 7 with a thickness d4 of 0.5 μm was then applied by means of laser ablation at 780° C. to the intermediate layer system 6 formed in this way. This conductor structure 2 was then heat treated at approximately 700° C. for approximately 30 minutes in pure oxygen in the coating chamber, and was then cooled down to room temperature within 20 minutes in the chamber. The critical current density $J_c$ of the conductor structure obtained in this way was then approximately $1 \times 10^5$ A/cm².

It is, of course, possible also to provide the conductor structure according to the invention as explained above with at least one layer to electrically stabilize its HTS layer or with a corresponding body or element composed of normally conductive material, such as silver or a silver alloy.

We claim:

1. An elongated superconductor structure for carrying an electric current in a predetermined direction, comprising:

a biaxially textured mount composed of metallic material;

an intermediate layer system including a first, relatively thicker, intermediate layer, of yttrium oxide deposited on said mount and a second, relatively thinner, intermediate layer of cerium oxide above said first intermediate layer; and a superconductor layer deposited on said second intermediate layer and composed of a high-$T_c$ superconductor material of $(RE)M_2Cu_3O_x$ with an RE component containing at least one rare earth metal, and an M component containing at least one alkaline-earth metal.

2. The superconductor structure according to claim 1, wherein said superconductor layer is formed of $AD_2Cu_3O_x$ material.

3. The superconductor structure according to claim 2, wherein the A component represents yttrium and other elements of its group, and the D component represents barium and other elements of its group, and wherein at least one of the yttrium and barium components is at least partially replaced by an element from the respectively corresponding group.

4. The superconductor structure according to claim 1, wherein said second intermediate layer has a thickness of less than 200 nm and at least 10 nm.

5. The superconductor structure according to claim 4, wherein said second intermediate layer has a thickness of less than 100 nm.

6. The superconductor structure according to claim 1, wherein said first intermediate layer has a thickness of between 200 nm and 2 μm.

7. The superconductor structure according to claim 1, wherein said superconductor layer has a thickness of at most 2 μm.

8. The superconductor structure according to claim 1, wherein said mount is composed of a material selected from the group consisting of nickel and a nickel alloy.

9. The superconductor structure according to claim 1, wherein said mount has a rolled texture, at least on a surface thereof facing said intermediate layer system.

10. The superconductor structure according to claim 1, wherein said mount has a strip form.

11. The superconductor structure according to claim 1, wherein said mount is part of a composite body having at least one further element.

12. The superconductor structure according to claim 1, which further comprises normally conductive material associated with said superconductor layer for electrical stabilization.

13. The superconductor structure according to claim 12, wherein said normally conductive material is a material selected from the group consisting of silver and a silver alloy.

14. A method of producing a high-temperature superconductor structure, which comprises:

providing a mount composed of metallic material;

depositing an intermediate layer system and a superconducting layer according to claim 1, by at least largely heteroepitaxially growing intermediate layers and the superconducting layer on the mount.

* * * * *